United States Patent [19]

Ransom et al.

[11] Patent Number: 4,494,016

[45] Date of Patent: Jan. 15, 1985

[54] HIGH PERFORMANCE MESFET TRANSISTOR FOR VLSI IMPLEMENTATION

[75] Inventors: Stephen A. Ransom, Huntingdon Valley; Tedd K. Stickel, Chalfont, both of Pa.

[73] Assignee: Sperry Corporation, New York, N.Y.

[21] Appl. No.: 401,484

[22] Filed: Jul. 26, 1982

[51] Int. Cl.³ ............... H03K 19/017; H03K 19/094; H03K 19/20

[52] U.S. Cl. ................... 307/450; 307/443; 307/270; 307/304; 357/15; 357/22

[58] Field of Search .......... 307/443, 446, 450, 475, 307/270, 304; 330/277, 307; 357/22, 15

[56] References Cited

U.S. PATENT DOCUMENTS 4,157,556  6/1979  Decker et al. ............... 357/22
4,173,764 11/1979  de Cremoux ............... 357/22
4,237,473 12/1980  Chiang ........................ 357/22 X
4,300,064 11/1981  Eden ........................... 307/450 X

OTHER PUBLICATIONS

Bechtel et al., "Design and Performance of the GaAs FET," *IEEE JSSC*, vol. SC-5, No. 6, 12-1970, pp. 319-323.

Eden et al., "Application of GaAs Integrated Circuits and Charge-Coupled Devices (CCDs) for High Speed Signal Processing", *Proc. Soc. Photo-Opt. Instrum. Eng.* (USA), SPIE, vol. 214, 1979, pp. 39-47.

Liechti, "Microwave Field-Effect Transistors—1976", *IEEE Trans. Microwave Theory & Tech.*, vol. MTT-24, No. 6, Jun. 1976, pp. 279-299.

Van Tuyl and Liechti, "High-Speed Integrated Logic with GaAs MESFET's", *IEEE JSSC*, vol. SC-9, No. 5, Oct. 1974, pp. 269-276.

Primary Examiner—Larry N. Anagnos
Assistant Examiner—David R. Hudspeth
Attorney, Agent, or Firm—John B. Sowell; Thomas J. Scott; Marshall M. Truex

[57] ABSTRACT

A gallium arsenide buffer amplifier for use in a very large scale integrated circuits is provided. The transistor device in the buffer amplifier has a uniform depth N+ source, gate and drain region and the N+ dopant concentration is made very high which effectively reduces the resistance of the transistor device and permits the area of the device to be reduced by more than one order of magnitude while maintaining high current and power levels.

10 Claims, 7 Drawing Figures

| Nd | NORMALIZED gm/C | NORMALIZED AREA f(W) | NORMALIZED POWER | NORMALIZED INPUT CAPACITANCE |
|---|---|---|---|---|
| $5 \times 10^{16}$ | 1 | 90.9 | 1 | 64.45 |
| $10^{17}$ | 1 | 1 | 1 | 1.0 |
| $3 \times 10^{17}$ | 1 | .055 | 1 | 0.095 |
| $5 \times 10^{17}$ | 1 | .025 | 1 | 0.056 |
| $10^{18}$ | 1 | .010 | 1 | 0.032 |

HIGH PERFORMANCE MESFET TRANSISTOR FOR VLSI IMPLEMENTATION

FIELD OF THE INVENTION

This invention is related to a high performance output driver for metal semiconductor field effect transistors (MESFET), very large scale integrated circuits (VLSI). More particularly, the invention relates to a GaAs depletion mode MESFET device especially adapted to receive low power digital input signals and further adapted to drive large capacitive loads with large voltage swings at very high speeds.

DESCRIPTION OF THE PRIOR ART

Most electronic digital equipment, such as computers and peripherals presently are designed to provide high-speed logic and signal processing circuits that have two distinct logic states.

Heretofore, it was well known that GaAs output drivers and buffer amplifiers could be made of depletion mode devices. GaAs depletion mode devices are normally ON and a negative voltage is applied between the gate and the source so that the electric field in the channel region is enlarged to pinch off or deplete the current flow in the channel.

In the most advanced form of GaAs depletion mode MESFET devices, the implant regions under the source and drain have a different N dopant concentration and/or a different dopant depth from the channel implant region under the gate. This permits control of the threshold voltage and breakdown voltage independant of parasitic source and drain contact resistances.

For example, it is common to construct the source and drain implant regions of a MESFET device with concentration of the implant dopants having $10^{18}$ atoms per cubic centimeter. In the same GaAs depletion mode MESFET device, it is common to construct the channel implant region under the gate with concentrations of implant dopants having only $10^{17}$ atoms per cubic centimeter.

The reason for employing the smaller concentration of implant dopants in the channel region under the gate is to permit the construction of MESFET devices with low threshold voltages and to increase the breakdown voltage to provide operable devices for digital operations, microwave operations and millimeter wavelength integrated circuit operations.

These most advanced prior art GaAs depletion mode MESFET devices are useful in high-speed low power digital integrated circuit applications, however, these prior art GaAs devices are not well suited for high power applications or for high density applications such as the type embodied in very large scale integrated circuits.

Attempts to increase the power of prior art GaAs depletion mode MESFET devices have been made be increasing the size of the device. As the device size is increased to achieve more power, a point is reached where high parasitic source and drain resistances restrict the performance of the device. Further, as a device size is increased, the size of the gate terminal overlying the active channel implant region is also increased, thereby, causing a proportional increase in the size of the input capacitance as well as an increase in the device output capacitance. The speed of operation of the integrated circuit is proportional to the associated capacitance, thus, the dynamic switching time of the associated digital circuitry is degraded substantially. Not only does the increase in the size of the device translate itself into increased switching time and delays due to an increase in capacitance, but the density of the device concentration on the integrated circuit chip is substantially degraded. As the devices on the chip become larger, the chip becomes larger and the length of the interconnecting lines between the devices on the chip becomes longer which produces yet further deterioration effects on speed of operation of the device.

It is well known that prior art GaAs depletion mode MESFET devices suffer performance degradation due to back-gate effects. When the optimum design rules are relaxed to compensate for the back-gate effect, additional area on the chip is used and the device density is further degraded.

It would be desirable to eliminate the prior art problems associated with attempts to produce high-speed depletion mode MESFET devices for use as power buffers or power amplifiers.

SUMMARY OF THE INVENTION

It is a principal object of the present invention to provide a new and improved GaAs buffer amplifier.

It is another principal object of the present invention to provide a new GaAs depletion mode device having improved transconductance per unit area.

It is yet another object of the present invention to provide a new depletion mode device having a uniform depth high dopant concentration implant region which is common to the drain, gate and source terminals.

It is yet another object of the present invention to provide a new depletion mode device for power amplification of low power signals which is smaller in area and faster than prior art devices.

It is yet another object of the present invention to provide a new depletion mode MESFET device for power amplification of low power signals which has lower input and output capacitance than prior art devices for similar power levels.

It is yet another object of the present invention to provide a novel GaAs depletion mode device which has inherent back-gate compensation.

It is yet another object of the present invention to provide a novel GaAs depletion mode power amplifier which is always ON and is particularly useful as a buffer amplifier, linear power amplifier, output buffer amplifier, row or column driver for solid state memory chips, refresh memory driver, gate array line driver as well as for other well known uses.

According to these and other objects of the present invention, there is provided a semi-insulating host GaAs substrate which has a uniform depth N+ source, gate and drain implant region in the substrate. The N+ implant region has a very high dopant concentration of approximately $10^{18}$ atoms per cubic centimeter which is effective to reduce the resistance of the device so that for predetermined current and power levels the areas of the source, gate and drain terminal regions may be made much smaller without reducing power output levels.

DESCRIPTION OF THE PREFERRED EMBODIMENT

Figure 1:
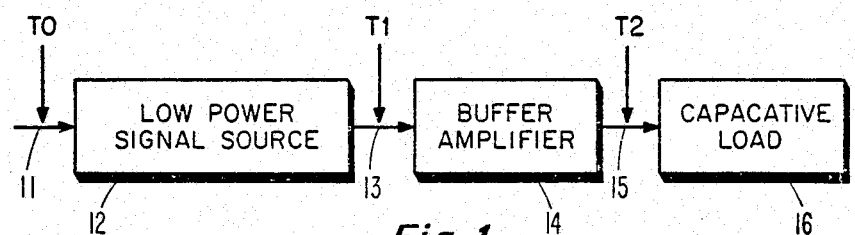
FIG. 1 is a schematic block diagram of a typical portion of a prior art circuit found in digital integrated circuits.

Refer now to FIG. 1 which is a block diagram employed to explain the problem presented in prior art depletion mode MESFET devices. An input signal waveform is initiated at time T0 and is applied to a low power signal source 12, such as low power logic circuitry, to produce a low power signal on line 13 at time T1. The low power signal on line 13 is applied to a buffer amplifier 14 at time T1 to produce an output driving signal on output line 15 at time T2. Typically, the load to be driven by such buffer amplifier is a large capacitive load 16 which presents a problem. The first problem associated with the block diagram is that the buffer amplifier 14 must be made large in order to drive the capacitive load 16 at high rates of speed. When the buffer amplifier 14 is made large in order to drive the capacitive load 16 it presents a much larger input and output capacitance to the circuit. Since the output capacitance of the buffer amplifier 14 is large, the buffer amplifier itself slows down its speed of operation. Secondly, since the input capacitance of the buffer amplifier 14 is large, the speed of operation of the low power signal source 12 is decreased. As will be explained in detail hereinafter, the typical prior art solution is to greatly increase the size and power of the buffer amplifier 14 which prevents this prior art solution from being incorporated into very large scale integrated circuits. Further, employing even a moderately increased size buffer amplifier causes lengthening of the interconnect signal lines thereby further slowing down speed of operation.

Figure 2:
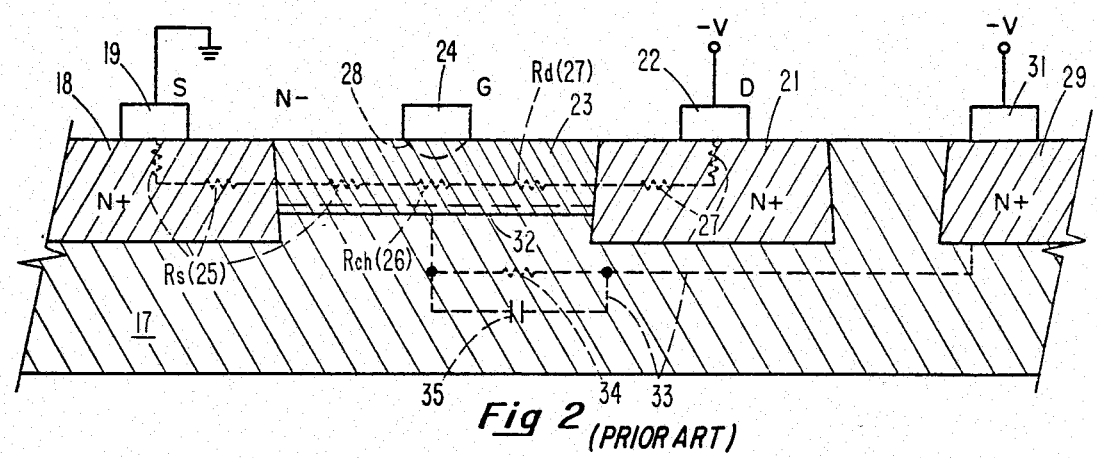
FIG. 2 is a schematic drawing in enlarged cross-section of the construction of a typical prior art GaAs metal semiconductor field effect transistor (MESFET) employed to explain the present invention.

Refer now to FIG. 2 which is a schematic drawing in enlarged cross-section showing the construction of a typical prior art GaAs metal semiconductor field effect transistor (MESFET). The GaAs semi-insulating substrate 17 is employed as a host for further processing to produce the MESFET device. A source implant region 18 is provided with a high N+ dopant concentration, such as silicon, to provide a base for good ohmic contact for the source terminal 19. The N+ maximum dopant concentration is of the order of $10^{18}$ atoms per cubic centimeter and the typical depth is approximately one thousand to two thousand angstroms. A similar drain implant region 21 is provided with a high concentration of N+ dopant, such as silicon, and is also adapted to provide good ohmic contact for the drain terminal 22. The channel implant region 23 between the implant regions 18 and 21 is provided with a low concentration N− dopant. The N− dopant is typically silicon. The depth of the channel implant region 23 is made thinner or more shallow than the source and drain implant regions and typically is made between eight hundred and sixteen hundred angstroms thick. The prior art light dopant concentration in the channel implant region is typically $10^{17}$ atoms per cubic centimeter or less. By making the source and drain implant regions 18 and 21 of a higher concentration than the channel implant region 23, and typically having a different depth, enables the designer of the prior art MESFET device to independently control the device intrinsic threshold voltage as well as the gate breakdown voltage with respect to the parasitic source and drain resistances 25 and 27 shown in phantom lines. The active channel resistance 26 shown in phantom lines represents the resistance in the channel which is under the direct control of the gate terminal 24 and its associated depletion region 28. In a typical operation of the device in FIG. 2, the source terminal 19 is grounded. When the voltage at the gate 24 is at the same level as the source 19, the depletion region 28 under the gate terminal 24 is very close to its minimum value in terms of depth. The minimum depletion region 28 allows maximum current flow from the drain terminal 22 to the source terminal 19 via the channel region 23. When the voltage on gate 24 approaches −1.0 volt with respect to the source 19, the depletion region 28 under the gate 24 pinches off the channel region 23 so as to substantially shut off the current flow between the drain 22 and the source 19. Accordingly, voltages applied to the gate 24 may effect switching operation of the device by turning the device ON and OFF.

An independent N+ region is shown on the substrate 17 having a negative voltage terminal 31. This independent region 29 is typically the N+ region of the source of an adjacent device. The back of the channel implant region 23, denoted by the numeral 32, forms the interface junction between the semi-insulating GaAs substrate 17 and the active channel region 23. The phantom region 32 at the back of channel region 23 is exaggerated to show that there is a shallow depletion region inherently present. Connecting the interface junction 32 and the independent region 29 is an electrical path 33 which comprises the lines 33, resistor 34 and capacitor 35. These parasitic elements 33, 34 and 35 form an active parasitic conductive path between the independent N+ region 29 and the N− channel region 23. The depletion region 32 formed at the back of the channel 23 may severely effect switching performance and may also effect functionality of the logic elements. In the example shown, it is obvious that the depletion region formed at the interface junction 32 diminishes the current in the channel region 23. The effect of the elements 33, 34 and 35 on a device is referred to in this art as the back-gate effect.

Figure 3:
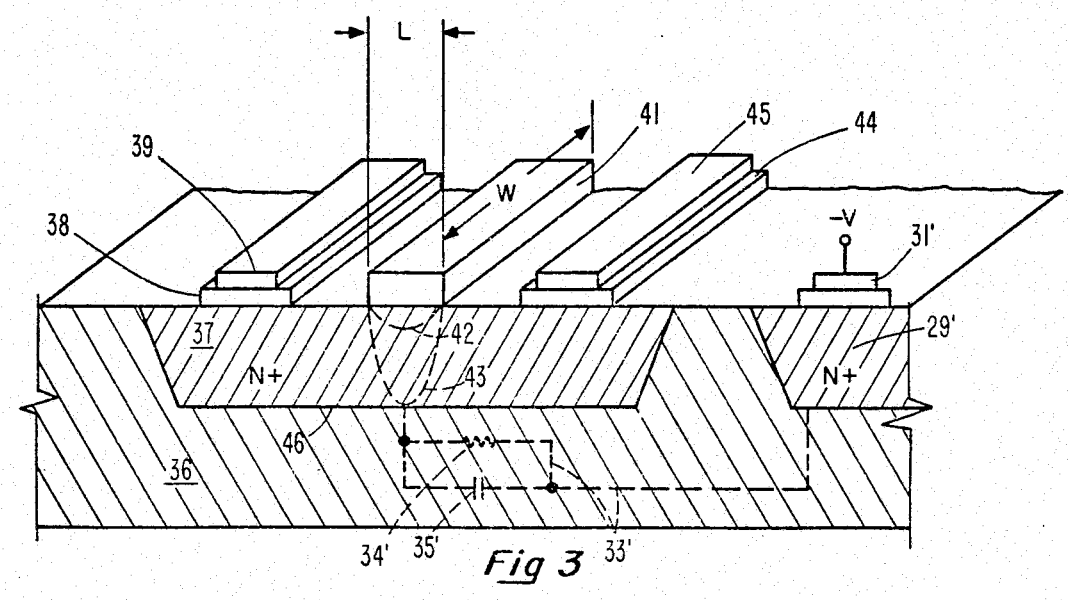
FIG. 3 is a schematic drawing in enlarged cross-section of the construction of the present invention metal semiconductor field effect transistor.

Refer now to FIG. 3 which is a schematic drawing in enlarged cross-section of the construction of a preferred embodiment GaAs metal semiconductor field effect transistor (MESFET). A semi-insulating GaAs host substrate 36 is shown having a uniform depth N+ source, gate and drain implant region 37. The N+ implant region 37 is provided with a silicon dopant concentration of aproximately $10^{18}$ atoms per cubic centimeter. It will be understood that those skilled in this art may employ different dopants, different concentration and different dopant depths to optimize the structure and to provide a very high N+ concentration under the source, gate and drain. For typical applications, the silicon dopant concentration may be on the order of five times $10^{17}$ to five times $10^{18}$ atoms per cubic centimeter. The ohmic contact 38 is typically made from gold-nickel-germanium deposited and alloyed to the implant region 37. The source terminal 39 is typically made from titanium-gold deposited on the ohmic contact region 38. A Schottky diode gate terminal 41 is deposited on the implant region 37 to provide the gate terminal for the device. The gate terminal is shown having a length "L" and a width "W" which will be employed to explain the enhanced performance achieved by the present invention. Below the gate terminal 41 is shown in phantom lines a first depletion region 42 and a second depletion region 43 typical of the ON and OFF conditions. An ohmic contact 44 is provided on the N+ region 37 and the drain terminal 45 is connected thereto. The ohmic contact and the drain terminal may be made of the same materials as the source ohmic contact and source terminal. An independent N+ region 29' is provided with a negative voltage terminal 31' similar to that shown in FIG. 2. The N+ region 29' is shown connected to the back 46 of the implant region 37. Even though there is a small depletion region at the back 46 of implant region 37, it is so small that it is negligible because of the very high N+ dopant concentration of the implant region 37. Accordingly, the parasitic resistance 34', parasitic capacitance 35' and the conductive line 33' connecting the independent region 29' and the back 46 of the implant region 37 have only a very minimal effect on the performance of the present invention device.

The depth of the depletion region at the back of the implant region 37 is a function of the square root of the dopant concentration in the channel region thus, when the dopant concentration is of an order of magnitude higher than the dopant concentration employed in the typical prior art device shown in FIG. 2 there is a reduction in the back depletion region depth of an order of three to one. When a ground or zero voltage is applied to the source 39 and a zero voltage is applied to the gate 41, the depletion region 42 is formed so that the device is in its ON condition or state. In order to shut the device OFF when a ground voltage is applied to the source 39, a voltage of approximately −20 volts must be applied to the gate 41 in order to achieve a depletion region as shown by the phantom lines 43. It will be noted that a −20 volt power supply voltage is incompatible with low power digital VLSI circuit applications. Accordingly, it will be explained hereinafter how this present invention may be incorporated into VLSI circuits in a linear amplifier application employing small power supply voltages. In FIG. 3, the input capacitance of the device is proportional to the area of the gate terminal 41 which is W×L. The input capacitance of the device is also proportional to the square root of the dopant concentration in the implant region 37 which has been explained as being of the order of magnitude $10^{18}$ atoms per cubic centimeter. The transconductance of the device of FIG. 3 is proportional to W/L times the square root of the dopant concentration in the implant region 37.

Figures 4, 5:
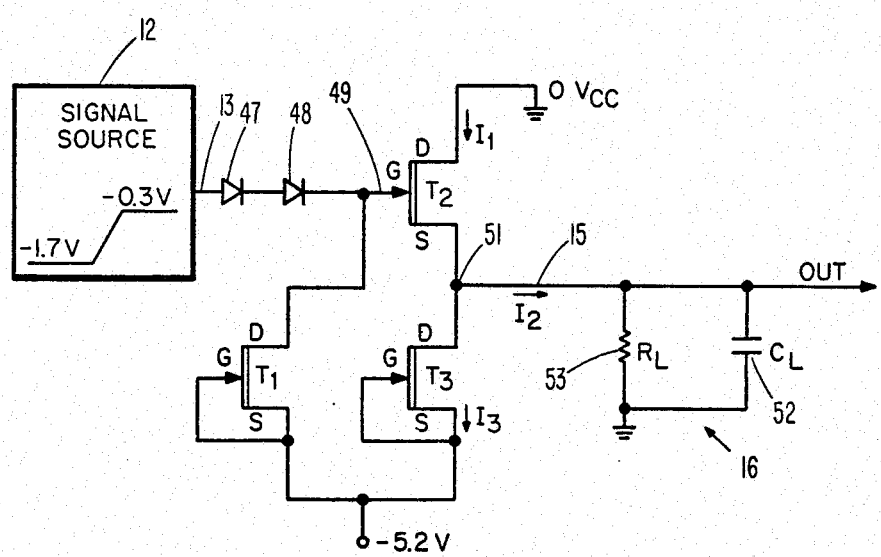
FIG. 4 is a chart of the performance characteristics of old and new depletion mode MESFET devices for different dopant concentrations employed in the channel region.
FIG. 5 is a schematic circuit diagram showing a preferred embodiment implementation of the novel structure semiconductor shown in FIG. 3.

Refer now to FIG. 4 showing performance characteristics of the depletion mode MESFET device for different dopant concentrations. Column 1 of FIG. 4 shows the dopant concentration ($N_d$) for various concentrations of operable MESFET devices. Column 2 shows the normalized transconductance which is a figure of merit gm divided by the input capacitance C. Column 3 is the normalized gate area which is a function of the width W of gate 41. Column 4 is the normalized power, which for purposes of this explanation is maintained constant, to better compare different devices. Column 5 shows the normalized input capacitance which is proportional to the area of the gate terminal 41 and the square root of the dopant concentration of the region 37. Row 1 illustrates that when the dopant concentration is five times $10^{16}$, the transconductance divided by input capacitance (figure of merit) is unity and the normalized area is very large for the assumed normalized power. Further, the normalized input capacitance is very high. Row 2 shows a typical dopant concentration of the N− region of $10^{17}$ similar to the prior art device shown in FIG. 2. The normalized transconductance in unity, the normalized area, the normalized power and normalized input capacitance is also made unity in Row 2 for purposes of comparison to other channel dopant concentrations. As the dopant concentration is increased from Row 1 or Row 2 prior art concentrations to three times $10^{17}$ shown in Row 3, to five times $10^{17}$ in Row 4, to the present preferred embodiment of $10^{18}$ shown in Row 5, the normalized area for the same device power decreases by a factor of one hundred to one. Further, as the normalized area decreases by a factor of two orders of magnitude, the normalized input capacitance also decreases by a factor of greater than thirty to one. Thus, it will be understood that the present invention can easily be incorporated into very large scale integrated circuits because of its substantial packing density improvement for a fixed or normalized power. Those skilled in this art will understand that by having a packing density by two orders of magnitude greater, that the interconnect lines and associated capacitance of the interconnect lines of the adjacent devices are substantially reduced and the speed of operation of the devices will be substantially enhanced or increased.

Refer now to FIG. 5 showing a preferred embodiment buffer amplifier 14 employing two of the improved devices shown in FIG. 3. The low power GaAs input signal source 12 provides a low level output voltage of −1.7 volts and a high level voltage of −0.3 volts on line 13. The output signal on line 13 is applied to the level shifting diodes 47 and 48 which drop the voltage 0.7 volts across each diode. The prior art type depletion mode current source pull-down transistor T1 serves as a current path for the level shifting diodes 47, 48 to the power supply of −5.2 volts. T1 stays normally ON.

The level shifted voltage on line 49 is applied to the gate of the new and improved depletion mode source follower transistor T2 which is identical in all respects to the constant current source pull-down transistor T3. The typical threshold voltage for the prior art type device T1 is approximately −1.0 volt and the threshold voltage for the new and improved devices T2 and T3 is approximately −20 volts. The level shifted voltage signals on line 49 are approximately −3.1 volts to −1.7 volts. The transistors T2 and T3 are designed to be in the always ON condition. The drain of transistor T2 is shown connected to ground. The voltage signal being applied at the gate of transistor T2 appears at the source of transistor T2 and at the output node 51 of the buffer amplifier. The buffer amplifier transistor T2 is operating as a source follower transistor and is also operating as a linear amplifier. In the digital mode of operation, transistor T2 is operated in one of the two distinct voltage states representative of the input. However, the circuit can be operated as a linear amplifier, in which case the input voltage will appear at the output node 51. When operated as a linear amplifier, the range of voltages being applied to the input gate of transistor T2 on line 49 may be expanded.

The current I1 flowing through transistor T2 is approximately equal to the current I3 flowing through the constant current source transistor T3 because the current I2 flowing in output line 15 is very small in comparison to the current I1. Since the transistors T2 and T3 are identical in all respects, the gate to source voltages across transistor T2 must be equal to the gate to source voltage across transistor T3, which is zero. This results in the beforementioned voltage follower action. The voltage swings being applied on line 49 to the gate of transistor T2 appears substantially unchanged at the output node 51.

Having explained the D.C. current levels of the buffer amplifier of FIG. 5, it will be understood that during transient operation, an appreciable flow of current flows in output line 15 when going from the low state to the high state. During transition from low to high, a large portion of the I1 current will flow into the output line 15 and charge the load capacitor 52 until it reaches the high voltage level of $-1.7$ volts at the node 51. Conversely, when the buffer amplifier is being driven from the high to the low state, a large portion of the I3 current is pulled out of the load capacitor 52 via line 15. As a result of the large flow of current during the transient operations, the novel buffer amplifier operates as a high-speed switch with substantial current amplification. While the load 16 is shown comprising a load capacitor 52 and a load resistor 53, it will be understood that the load 16 could comprise a number of parallel loads in a fan-out configuration. Further, even though the novel transistors T2 and T3 have threshold voltages of approximately $-20$ volts, the novel buffer amplifier may be operated at standard GaAs voltage levels without the requirement for a $-20$ volt power source. The reason for this advantageous operation is that the buffer amplifier T2 is being operated in the linear mode of operation where velocity saturation occurs and does not require the high power supply as would be required if the transistor was used as a power switch.

Figure 6:
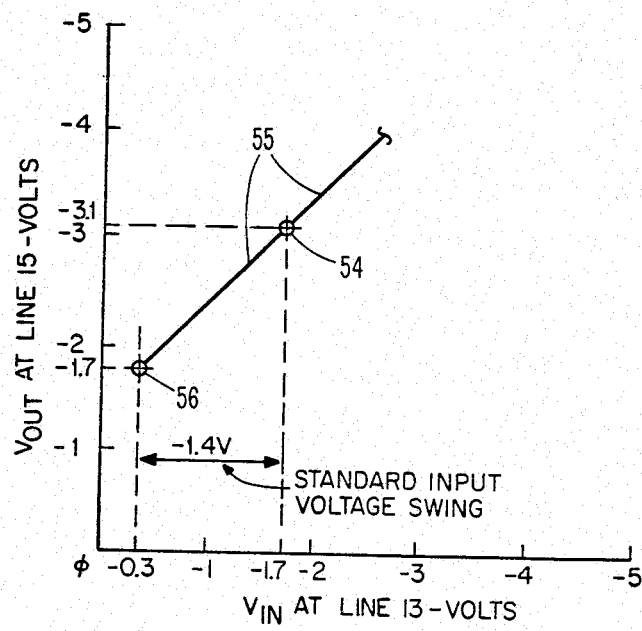
FIG. 6 is a curve showing the typical transfer characteristic for the new device embodied in a circuit similar to FIG. 5.

Refer now to FIG. 6 showing the transfer characteristics of the novel buffer amplifier shown in FIG. 5. As explained hereinbefore, when the low threshold voltage of $-1.7$ volts is applied to the input line 13, the voltage is stepped down by the diodes 47, 48 and appears at the gate of transistor T2 on line 49 and on line 15 as being 1.4 volts lower or $-3.1$ volts. The point 54 on the transfer curve 55 indicates this point. When the high level voltage signal of $-0.3$ volts is applied to the input line 13, it appears at the gate of transistor T2 on line 49 and on line 15 as a $-1.7$ volt signal. This point is shown on the transfer characteristic curve as point 56. The transfer characteristic of voltage IN versus voltage OUT is shown being extended to approximately $-4$ volts at the output. The power supply voltage in the preferred embodiment buffer amplifier circuit of FIG. 5 is only $-5.2$ volts and when a much higher power supply voltage is applied, the voltage characteristic curve 55 may be extended.

Figure 7:
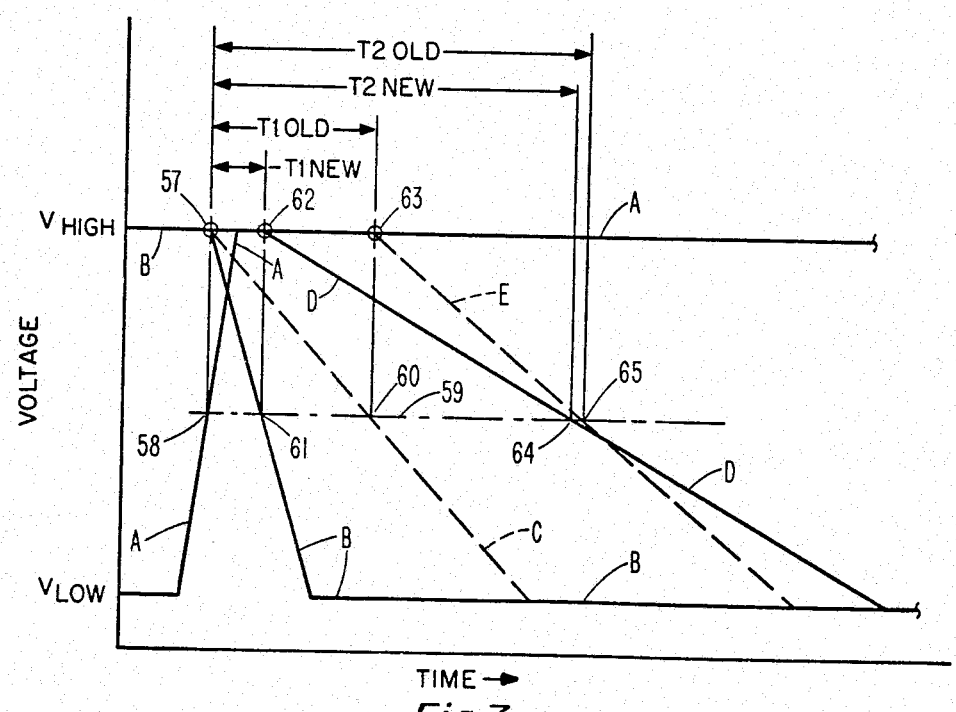
FIG. 7 is a timing diagram showing the resulting waveforms associated with points of the circuits of FIGS. 1 and 5.

Refer now to FIG. 7 showing a set of propagation delay curves. Refer also to FIG. 1 for the explanation of the propagation delay in FIG. 7. The prior art input voltage signal on line 11 of FIG. 1 is shown as waveform A which rises from the low level voltage ($V_{LOW}$) to the high level voltage ($V_{HIGH}$) and extends to the right. The inverted prior art output waveform B on line 13 is shown starting at the high level voltage ($V_{HIGH}$) until it reaches the point 57. It then makes a downward transition until it reaches the low level voltage ($V_{LOW}$) and there it extends to the right. The transition point 58 of waveform A is half-way between the high level and the low level voltages. The transition point of the waveform is indicated by the center line 59. The half-way point 58 is indicative of the start of transition time T0 on input line 11. The output waveform B starts from its high voltage level and reaches its midway switching point 61 very rapidly as shown by the time delay T1 new. For comparison purposes, an input-output waveform C of a typical prior art amplifier is shown starting from the high voltage level until it reaches the same point 57. It then follows the phantom transition line of waveform C through the midway switching point 60 until it reaches the low level voltage and then extends outward to the right. The switching time T1 old for the low power signal source is substantially greater than the T1 new switching time when the present invention buffer amplifier is employed. One of the reasons that the switching time delay has been substantially reduced is because the devices on the chip have been made much smaller by an order of thirty to one hundred times. This size reduction substantially reduces the input capacitance which allows the input power signal source to drive the buffer amplifier faster.

Waveform D shows the novel non-inverting output voltage waveform on line 15 employing the new buffer amplifier of FIG. 5. The output voltage starts at the same high level as waveform B and stays high until it reaches the point 62 where it starts its transition to the low voltage condition. Waveform E shows the output voltage on line 15 for the prior art buffer amplifier. The voltage starts at the high voltage condition and proceeds to point 63 before it starts its downward transition to the low voltage condition ($V_{LOW}$). The half-way point 64 on waveform D occurs before the half-way point 65 on waveform E. The same voltage levels and approximately the same amount of circuit power is being dissipated using the new buffer amplifier as was employed using the prior art buffer amplifier. The important feature of the present invention is that the new buffer amplifier only requires one thirtieth to one hundredth the area required by the prior art buffer amplifier to accomplish at least the same speed-power performance characteristic. Those skilled in the present art will understand that if additional speed enhancement is desired, it may be obtained by increasing the area of the buffer amplifier device, thus, producing faster transition times. The FIG. 7 illustration has been designed to show that a very large area enhancement can be achieved while maintaining the same power and driving at a slightly faster switching speed.

Having explained a preferred embodiment metal semiconductor field effect transistor (MESFET) GaAs device, it will be understood that the same MESFET technology may be employed with silicon devices. Further, it will be understood that the preferred embodiment MESFET device has been embodied in a novel buffer amplifier for digital operations and the same buffer amplifier may be used as a linear amplifier. The input voltage range of the linear amplifier may be extended by increasing the power supply voltage, and a value of the power supply voltage can be reached where the transistor T2 is turned to the OFF condition.

Another advantage of the present MESFET buffer amplifier device is that it may be manufactured without modification to the present state of the art processing steps, thus, the present invention is a substantial improvement in increasing packing densities of amplifier devices required for VLSI chips.

We claim:

1. A GaAs depletion mode transistor device for processing low power input digital signals at high speeds, comprising:

a semi-insulating host GaAs substrate, a uniform depth N+ ion implant region in said substrate, said ion implant region comprising source, channel and drain regions, said N+ implant region having a uniform heavy dopant concentration greater than $2.5 \times 10^{17}$ up to $5 \times 10^{18}$ atoms per cubic centimeter, an ohmic contact source terminal on said implant region for connection to a reference source voltage, an output line connected to said source terminal, an ohmic contact drain terminal on said implant region for connection to a Vcc voltage source, a Schottky diode gate terminal on said implant region having an area defined by its width and its length, whereby low power input signals applied at the gate terminal of said device are power amplified at high speeds at said output line.

2. A GaAs depletion mode device as set forth in claim 1 wherein the width of said Schottky diode gate terminal is reduced for the same power output levels as depletion mode devices having non-uniform depth, non-uniform ion implant region concentrations and a low channel dopant concentration of only $1 \times 10^{17}$ atoms per cubic centimeter.

3. A GaAs depletion mode device as set forth in claim 2 wherein the reduction in the width of said Schottky diode gate terminal is by a factor of approximately thirty-five.

4. A GaAs depletion mode device as set forth in claim 2 wherein the reduction in the width of said Schottky diode gate terminal is by a factor of between thirty and one hundred.

5. A GaAs depletion mode device as set forth in claim 2 wherein the input capacitance to said GaAs depletion mode device is reduced by reducing the area of the Schottky diode gate terminal even though the capacitance per unit area is increased by providing a high N+ dopant concentration than said devices having a low channel dopant concentration of only $1 \times 10^{17}$ atoms per cubic centimeter.

6. A GaAs depletion mode device as set forth in claim 5 wherein the transconductance per unit area of said GaAs depletion mode device is increased proportional to the square root of the increase in the channel N+ dopant concentration; and the overall device transconductance is decreased proportional to the reduction in the area of the Schottky diode gate terminal to provide substantially the same transconductance divided by capacitance as in said GaAs depletion mode devices having a channel dopant concentration of only $1 \times 10^{17}$ atoms per cubic centimeter with a significant decrease in required device area for the same power output.

7. A GaAs depletion mode device as set forth in claim 3 wherein the reduction in the area of the Schottky diode gate terminal is by a factor of thirty-five which decreases the input capacitance by a factor of approximately ten.

8. A GaAs depletion mode transistor device connected in a power amplifier circuit, comprising:

said depletion mode transistor device having gate, source and drain terminals, a uniform depth N+ ion implant region under said gate, source and drain terminals, said N+ ion implant region having a uniform heavy dopant concentration greater than $2.5 \times 10^{17}$ up to $5 \times 10^{18}$ atoms per cubic centimeter providing a high threshold voltage, said drain terminal being connected to a $V_{CC}$ voltage source, said source terminal being coupled to a reference source voltage, an output line connected to said source terminal, a high capacitive load connected to said source terminal and said output line, and a low power digital input signal source connected to said gate terminal, whereby low current digital input signals applied to said gate terminal are translated to said output line as high current output signal.

9. A GaAs depletion mode device as set forth in claim 8 which further includes, a level shifting network coupled between said low power digital input signal source and the gate terminal of said device, and said pull-down transistor connected to said reference source voltage and the gate of said device.

10. A GaAs depletion mode device as set forth in claim 8 which further includes, a second GaAs depletion mode transistor device in series with and having the same characteristics as said GaAs depletion mode device, said reference voltage source being connected to the source of said second GaAs depletion mode device, the gate of said second GaAs depletion mode device being connected to enable current conduction through the channel thereof, and said high capacitive load being connected to the source of said GaAs depletion mode device and the drain of said second GaAs depletion mode device to provide a voltage follower power amplifier.

* * * * *